United States Patent
Lee et al.

(10) Patent No.: US 10,613,393 B2
(45) Date of Patent: Apr. 7, 2020

(54) CONDUCTIVE STRUCTURE, ELECTRODE COMPRISING SAME, AND DISPLAY DEVICE

(71) Applicant: LG CHEM, LTD., Seoul (KR)

(72) Inventors: Ilha Lee, Daejeon (KR); Song Ho Jang, Daejeon (KR); Jin Hyuk Min, Daejeon (KR); Ki-Hwan Kim, Daejeon (KR); Chan Hyoung Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 85 days.

(21) Appl. No.: 15/758,326

(22) PCT Filed: Oct. 24, 2016

(86) PCT No.: PCT/KR2016/011954
§ 371 (c)(1),
(2) Date: Mar. 7, 2018

(87) PCT Pub. No.: WO2017/073969
PCT Pub. Date: May 4, 2017

(65) Prior Publication Data
US 2018/0252951 A1    Sep. 6, 2018

(30) Foreign Application Priority Data
Oct. 27, 2015 (KR) .................. 10-2015-0149498

(51) Int. Cl.
*G02F 1/1343* (2006.01)
*G02F 1/1362* (2006.01)
(Continued)

(52) U.S. Cl.
CPC ........ *G02F 1/1343* (2013.01); *G02F 1/13439* (2013.01); *G02F 1/136286* (2013.01);
(Continued)

(58) Field of Classification Search
CPC .............. G02F 1/1343; G02F 1/13439; G02F 1/136286; G02F 1/134363;
(Continued)

(56) References Cited

U.S. PATENT DOCUMENTS

2008/0252204 A1* 10/2008 Yoshida ............. H01L 51/5203
313/504
2013/0208198 A1* 8/2013 Choi ................. G02F 1/133382
349/15
(Continued)

FOREIGN PATENT DOCUMENTS

JP    2006162942    6/2006
JP    2015526370    9/2015
(Continued)

OTHER PUBLICATIONS

Ofice Action of Korean Patent Office in Appl'n No. 10-2015-0149498 dated Jan. 3, 2019.

*Primary Examiner* — Stephen G Sherman
(74) *Attorney, Agent, or Firm* — Dentons US LLP

(57) ABSTRACT

The present specification relates to a conductive structure body, and an electrode and a display device including the same.

14 Claims, 2 Drawing Sheets

(51) Int. Cl.
  *G06F 3/041* (2006.01)
  *H01L 51/52* (2006.01)
(52) U.S. Cl.
  CPC ........ *G06F 3/0412* (2013.01); *H01L 51/5203* (2013.01); *H01L 51/5215* (2013.01); *G02F 1/134363* (2013.01); *G02F 2201/121* (2013.01); *G02F 2201/38* (2013.01); *G02F 2203/01* (2013.01)
(58) Field of Classification Search
  CPC ........... G02F 2201/121; G02F 2201/38; G02F 2203/01; G06F 3/0412; H01L 51/5203; H01L 51/5215
  See application file for complete search history.

(56) References Cited

U.S. PATENT DOCUMENTS

| | | | |
|---|---|---|---|
| 2015/0002936 A1 | 1/2015 | Jun et al. | |
| 2015/0009427 A1* | 1/2015 | Chen | G06F 3/044 349/12 |
| 2015/0158763 A1 | 6/2015 | Jun | |
| 2015/0205326 A1 | 7/2015 | Lim et al. | |
| 2015/0212539 A1 | 7/2015 | Hong et al. | |
| 2016/0109356 A1* | 4/2016 | Morita | C01G 23/053 422/554 |

FOREIGN PATENT DOCUMENTS

| | | |
|---|---|---|
| KR | 10-2014-0030075 | 3/2014 |
| KR | 10-2014-0046944 | 4/2014 |
| KR | 10-2015-0004255 | 1/2015 |

* cited by examiner

[Figure 1]
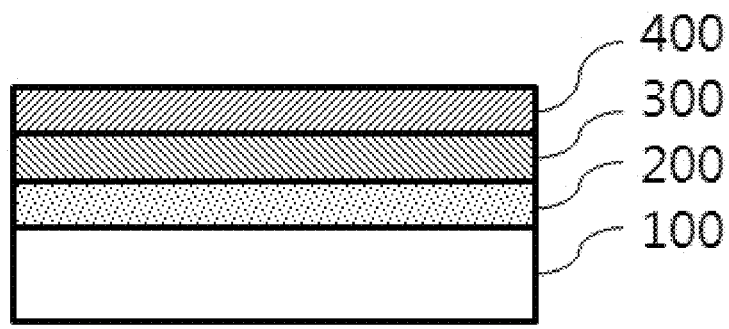
[Figure 2]
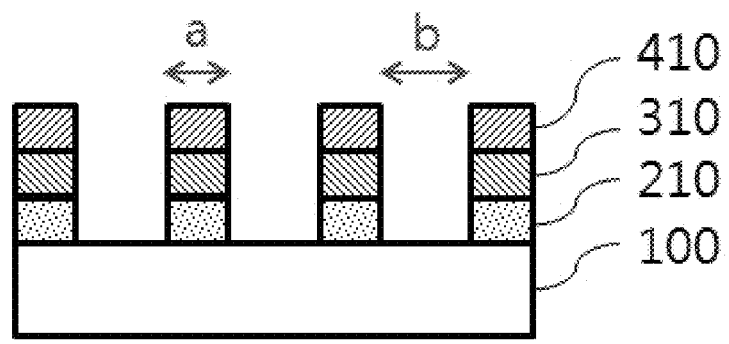

[Figure 3]
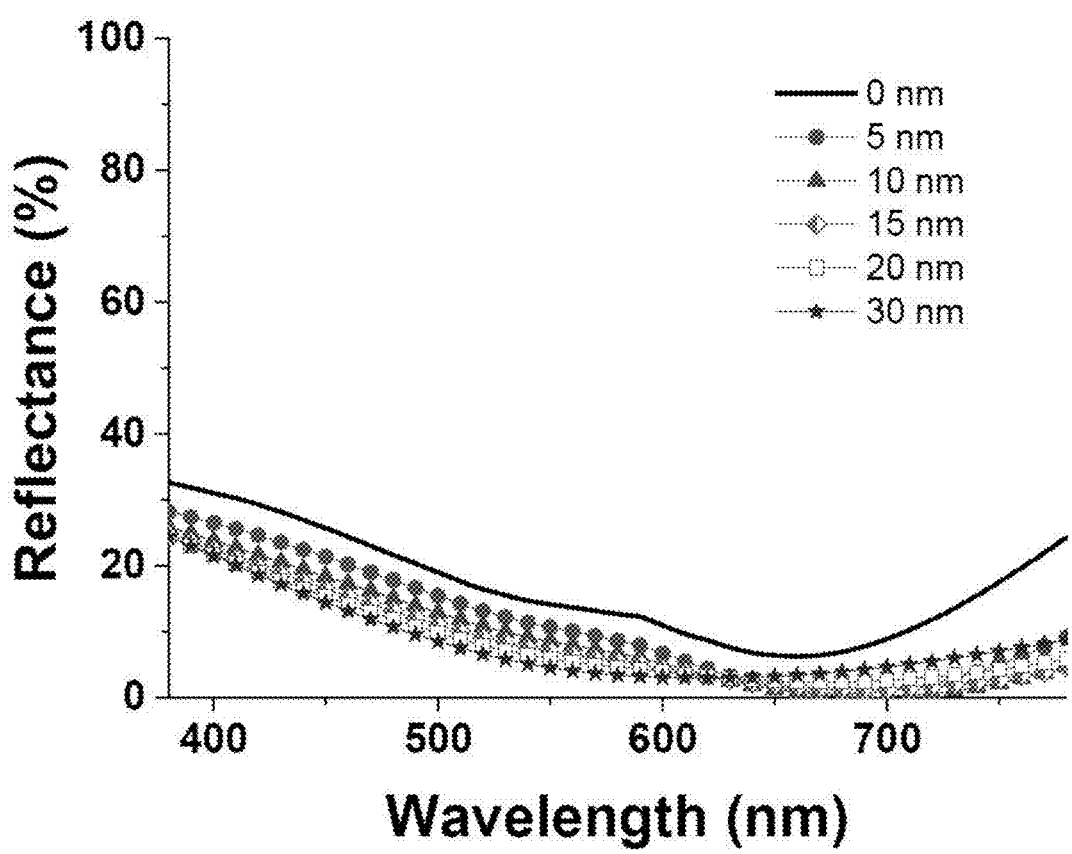

CONDUCTIVE STRUCTURE, ELECTRODE COMPRISING SAME, AND DISPLAY DEVICE

This application is a National Stage Application of International Application No. PCT/KR2016/011954 filed on Oct. 24, 2016, which claims priority to and the benefit of Korean Patent Application No. 10-2015-0149498, filed in the Korean Intellectual Property Office on Oct. 27, 2015.

TECHNICAL FIELD

This application claims priority to and the benefit of Korean Patent Application No. 10-2015-0149498, filed in the Korean Intellectual Property Office on Oct. 27, 2015, the entire contents of which are incorporated herein by reference.

The present specification relates to a conductive structure body, and an electrode and a display device including the same.

BACKGROUND ART

A liquid crystal display device is the most important display device recently used in a multimedia society, and is widely used in a mobile phone, a monitor for a computer, a notebook computer, and a television. The liquid crystal display device has a TN mode, in which a liquid crystal layer, in which nematic liquid crystals are arranged in a twist form, is interposed between two orthogonal polarizing plates, and then an electric field is applied in a direction vertical to a substrate. In the TN mode scheme, since the liquid crystals are aligned in the direction vertical to the substrate when a black color is displayed, double refraction and light leakage are incurred by liquid crystal molecules at an inclined viewing angle.

In order to solve the viewing angle problem in the TN mode scheme, an in-plane switching (IPS) mode, in which two electrodes are formed on one substrate, and a director of the liquid crystal is controlled with a lateral electric field generated between the two electrodes, has been introduced. That is, the IPS mode scheme is also referred to as an in-plane switching liquid crystal display or a horizontal electric field type liquid crystal display, and an electrode is disposed on the same plane within a cell, in which the liquid crystal is disposed, so that the liquid crystals are not aligned in a vertical direction, but are aligned to be parallel to a horizontal surface of the electrode.

However, in the case of the IPS mode scheme, it may be difficult to implement a high quality image by high light reflectance of a pixel electrode and a common electrode.

RELATED ART LITERATURE

Patent Document

Korean Patent Application Laid-Open No. 10-2010-0007605

DISCLOSURE

Technical Problem

The present specification provides a conductive structure body, which is capable of implementing a high quality image display.

Technical Solution

An exemplary embodiment of the present specification provides a conductive structure body, including: a substrate; a first metal layer provided on the substrate, and formed of a single metal; a second metal layer provided on at least one surface of the first metal layer, formed of two or more kinds of metal, and formed of a translucent material; and a light reflection reducing layer provided on the second metal layer and formed of a translucent material, in which the light reflection reducing layer includes an oxynitride of the metal forming the second metal layer, and average light reflectance in the surface of the light reflection reducing layer in light having a wavelength of 380 nm to 780 nm is decreased by 7% to 50% compared to a case where the second metal layer is not provided.

Another exemplary embodiment of the present specification provides an electrode including the conductive structure body.

Still another exemplary embodiment of the present specification provides a display device including the electrode.

Advantageous Effects

The conductive structure body according to the exemplary embodiment of the present specification may implement low light reflectance by controlling light reflectance of the metal layer.

The conductive structure body according to the exemplary embodiment of the present specification includes the conductive line having low light reflectance and a fine line width, thereby implementing high visibility.

In the conductive structure body according to the exemplary embodiment of the present specification, the second metal layer may minimize deterioration of electric conductivity, and improve an effect of reducing light reflectance by the light reflection reducing layer.

DESCRIPTION OF DRAWINGS

FIG. 1 is a diagram illustrating a laminated structure of a conductive structure body according to an exemplary embodiment of the present specification.

FIG. 2 is a diagram illustrating a laminated structure of a case where the conductive structure body according to the exemplary embodiment of the present specification is patterned.

FIG. 3 is a graph illustrating simulation data of light reflectance of conductive structures bodies according to the Example and the Comparative Example.

MODE FOR INVENTION

In the present specification, when it is said that a specific member is positioned "on" the other member, this includes a case where another member is present between two members, as well as a case where the specific member is in contact with the other member.

In the specification, unless explicitly described to the contrary, when it is said that a specific part "comprises" a specific constituent element, this means that another constituent element may be further included, not that another constituent element is excluded.

Hereinafter, the present specification will be described in more detail.

An exemplary embodiment of the present specification provides a conductive structure body, including: a substrate;

a first metal layer provided on the substrate, and formed of a single metal; a second metal layer formed on at least one surface of the first metal layer, formed of two or more kinds of metal, and is formed of a translucent material; and a light reflection reducing layer formed on the second metal layer and formed of a translucent material, in which the light reflection reducing layer includes a metallic oxynitride forming the second metal layer, and average light reflectance in a surface of the light reflection reducing layer at light having a wavelength of 380 nm to 780 nm is reduced by 7% to 50% compared to a case where the second metal layer is not provided.

The translucent material means a material, of which transmissivity in a visible ray region is not 0%. Particularly, the translucent material may mean a material, of which light transmissivity in a visible ray region is 1% or more and 60% or less.

FIG. 1 is a diagram illustrating a laminated structure of a conductive structure body according to an exemplary embodiment of the present specification. Particularly, FIG. 1 illustrates the conductive structure body, in which a substrate 100, a first metal layer 200, a second metal layer 300, and a light reflection reducing layer 400 are sequentially provided. However, the present invention is not limited to the structure of FIG. 1, and an additional layer may be further provided.

According to the exemplary embodiment of the present specification, the conductive structure body may have a structure, in which a substrate, a first metal layer, a second metal layer, and a light reflection reducing layer are sequentially provided.

Further, according to the exemplary embodiment of the present specification, the conductive structure body may have a structure, in which a substrate, a light reflection reducing layer, a second metal layer, and a first metal layer are sequentially provided.

The second metal layer may serve to control light reflection of the first metal layer in a lower side together with the light reflection reducing layer. Particularly, through an optical design, it is possible to suppress a blinding phenomenon of the conductive laminated body by minimizing reflection of light, which passes through the light reflection reducing layer and the second metal layer and reaches a surface of the first electrode layer.

The second metal layer is a translucent material, and is formed in a very small thickness and does not cause a decrease in productivity. Additionally, the second metal layer may prevent the metal of the light reflection reducing layer from being diffused to the lower layer.

According to the exemplary embodiment of the present specification, the first metal layer may be formed of a metal, of which average light reflectance at light having a wavelength of 380 nm to 780 nm in a thickness having 0% of light transmissivity is 60% to 100%.

According to the exemplary embodiment of the present specification, the first metal layer may be formed of Cu, Al, Mo, Ti, Ag, Ni, Mn, Au, Cr, or Co. Particularly, according to the exemplary embodiment of the present specification, the first metal layer may be formed of Cu or Al.

According to the exemplary embodiment of the present specification, the second metal layer may be formed of two kinds of metal, of which average light reflectance at light having a wavelength of 380 nm to 780 nm in a thickness having 0% of light transmissivity is 40% to 60%.

According to the exemplary embodiment of the present specification, the second metal layer may be formed of two metals selected from the group consisting of Cu, Al, Mo, Ti, Ag, Ni, Mn, Au, Cr, and Co. Particularly, according to the exemplary embodiment of the present specification, the second metal layer may include two or more metals selected from the group consisting of Cu, Mo, Ti, and Ni.

According to the exemplary embodiment of the present specification, the second metal layer may be formed of two or more metals among Cu, Al, Mo, Ti, Ag, Ni, Mn, Au, Cr, and Co. Particularly, according to the exemplary embodiment of the present specification, the second metal layer may include two or more metals among Cu, Mo, Ti, and Ni. More particularly, according to the exemplary embodiment of the present specification, the second metal layer may be formed of MoTi.

According to the exemplary embodiment of the present specification, the light reflection reducing layer may include an oxynitride of two or more metals selected from the group consisting of Cu, Al, Mo, Ti, Ag, Ni, Mn, Au, Cr, and Co. Particularly, according to the exemplary embodiment of the present specification, the light reflection reducing layer may include an oxynitride of two or more metals selected from the group consisting of Cu, Mo, Ti, and Ni. More particularly, according to the exemplary embodiment of the present specification, the light reflection reducing layer may include an oxynitride of MoTi.

According to the exemplary embodiment of the present specification, a thickness of the first metal layer may be 10 nm or more and 1 μm or less. Particularly, according to the exemplary embodiment of the present specification, a thickness of the first metal layer may be 100 nm or more, and more particularly, 150 nm or more. Further, according to the exemplary embodiment of the present specification, a thickness of the first metal layer may be 500 nm or less, and more particularly, 200 nm or less. Electric conductivity of the first metal layer depends on a thickness, so that when the first metal layer is excessively thin, a continuous thickness is not formed, so that there may be a problem in that a value of specific resistance is increased, and thus a thickness of the first metal layer may be 100 nm or more.

According to the exemplary embodiment of the present specification, a thickness of the second metal layer may be 3 nm or more and 35 nm or less.

Particularly, the second metal layer may be formed of a translucent material within the thickness range. Particularly, the second metal layer may secure a decrease in reflectance through interference of the first metal layer, the second metal layer, and the reflection reducing layer through the pass of light.

According to the exemplary embodiment of the present specification, a thickness of the light reflection reducing layer may be 10 mm or more and 100 nm or less. Particularly, according to the exemplary embodiment of the present specification, a thickness of the light reflection reducing layer may be 20 mm or more and 60 nm or less. More particularly, according to the exemplary embodiment of the present specification, a thickness of the light reflection reducing layer may be 30 mm or more and 60 nm or less.

When a thickness of the light reflection reducing layer is less than 10 nm, there may occur a problem in that it fails to sufficiently decrease high light reflectance by the first metal layer. Further, when a thickness of the light reflection reducing layer is more than 100 nm, there may occur a problem in that it is difficult to pattern the light reflection reducing layer.

According to the exemplary embodiment of the present specification, in the light having a wavelength of 380 nm to 780 nm, average light reflectance in a surface of the light reflection reducing layer may be 25% or less. Particularly, according to the exemplary embodiment of the present specification, in the light having a wavelength of 380 nm to 780 nm, average light reflectance in the surface of the light reflection reducing layer may be 20% or less. More particularly, according to the exemplary embodiment of the present specification, in the light having a wavelength of 380 nm to 780 nm, average light reflectance in the surface of the light reflection reducing layer may be 15% or less. According to the exemplary embodiment of the present specification, average light reflectance in the surface of the light reflection reducing layer may be 1% or more.

The average light reflectance may be measured in an opposite surface of the light reflection reducing layer adjacent to the second metal layer. Particularly, the average light reflectance may be measured in a surface, in which the conductive structure body is exposed to a view.

According to the exemplary embodiment of the present specification, in the light having a wavelength of 380 nm to 780 nm, an extinction coefficient k of the second metal layer may be 2.9 or more and 3.8 or less.

According to the exemplary embodiment of the present specification, in the light having a wavelength of 380 nm to 780 nm, an extinction coefficient k of the light reflection reducing layer may be 0.2 or more and 1 or less.

The extinction coefficient may be measured by using the Ellipsometer measurement equipment, which is well-known in the art.

The extinction coefficient k may be called an absorption coefficient, and is an index defining how strong the conductive structure body absorbs light at a predetermined wavelength and a factor determining transmittance of the conductive structure body.

According to the exemplary embodiment of the present specification, the conductive structure body may include conductive lines provided on the substrate, and the conductive line may include the first metal layer, the second metal layer, and the light reflection reducing layer.

According to the exemplary embodiment of the present specification, the first metal layer may be a first metal pattern layer. According to the exemplary embodiment of the present specification, the second metal layer may be a second metal pattern layer. According to the exemplary embodiment of the present specification, the light reflection reducing layer may be a light reflection reducing pattern layer.

According to the exemplary embodiment of the present specification, the conductive line may include a conductive pattern including a plurality of openings, and the conductive lines dividing the plurality of openings.

According to the exemplary embodiment of the present specification, the conductive line may include the first metal pattern layer, the second metal pattern layer, and the light reflection reducing pattern layer.

According to the exemplary embodiment of the present specification, the conductive line may form a regular pattern or an irregular pattern. Particularly, the conductive line may be provided while forming the pattern on the substrate through a patterning process.

Particularly, the pattern may be a polygonal shape, such as a triangle and a quadrangle, a circle, an ellipse, or a formless form. The triangle may be an equilateral triangle or a right-angled triangle, and the quadrangle may be a square, a rectangle, or a trapezoid.

As the regular pattern, a pattern form in the art, such as a mesh pattern, and the like may be used. The irregular pattern is not particularly limited, but may also be a boundary form of figures constituting a Voronoi diagram. According to the exemplary embodiment of the present specification, in the case where the pattern form adopts the irregular pattern, a diffracted pattern of reflected light by lighting having directivity may be removed by the irregular pattern, and an effect of scattered light may be minimized by the light reflection reducing pattern layer, such that the problem in visibility may be minimized.

According to the exemplary embodiment of the present specification, a line width of the conductive line may be 0.1 μm or more and 100 μm or less. Particularly, according to the exemplary embodiment of the present specification, a line width of the conductive line may be 0.1 μm or more and 50 μm or less, 0.1 μm or more and 30 μm or less, or 0.1 μm or more and 10 μm or less, but is not limited thereto. A line width of the conductive line may be designed according to a final use of the conductive structure body.

When the line width of the conductive line is less than 0.1 μm, it may be difficult to implement the pattern, and when the line width of the conductive line is more than 100 μm, visibility may be degraded.

According to the exemplary embodiment of the present specification, the first metal pattern layer, the second metal pattern layer, and the light reflection reducing pattern layer may have the pattern having the same shape. However, the line widths of the first metal pattern layer, the second metal pattern layer, and the light reflection reducing pattern layer do not need to be completely the same as the line widths of the respective adjacent pattern layers, and a case where the line widths of the first metal pattern layer, the second metal pattern layer, and the light reflection reducing pattern layer are smaller or larger than the line widths of the adjacent pattern layers is included in the scope of the present specification. Particularly, the line width of the second metal pattern layer may be 80% or more and 120% or less of the line width of the first metal pattern layer. Further, the line width of the light reflection reducing pattern layer may be 80% or more and 120% or less of the line width of the second metal pattern layer. More particularly, the line width of the light reflection reducing pattern layer may be the same as or larger than the line width of the second metal pattern layer.

When the line width of the light reflection reducing pattern layer is larger than the line width of the second metal pattern layer, an effect of hiding the first or second metal pattern layer by the light reflection reducing pattern layer when a user views the conductive structure body may be larger, so that it is possible to efficiently block the effect by glossiness of the metal layer itself or the reflection of the metal layer. However, even though the line width of the light reflection reducing pattern layer is the same as the line width of the second metal pattern layer, it is possible to achieve an effect of reducing light reflection.

According to the exemplary embodiment of the present specification, a line interval between the adjacent conductive lines may be 0.1 μm or more and 100 μm or less.

According to the exemplary embodiment of the present specification, the line interval of the conductive lines may be 0.1 μm or more, particularly, 10 μm or more, and more particularly, 20 μm or more. Further, according to the exemplary embodiment of the present specification, the line interval of the conductive lines may be 100 μm or less, particularly, 30 μm or less.

According to the exemplary embodiment of the present specification, the conductive line may be implemented with a pattern of a fine line width, and an electrode including the conductive line may implement excellent visibility.

FIG. 2 is a diagram illustrating a laminated structure of a case where the conductive structure body according to the exemplary embodiment of the present specification is patterned. Particularly, FIG. 2 illustrates a laminated structure of the conductive line in the conductive structure body according to the exemplary embodiment of the present specification. FIG. 2 illustrates the laminated structure, in which a substrate 100, a first patterned metal layer 210, a second patterned metal layer 310, and a patterned light reflection reducing layer 410 are sequentially provided. However, the present invention is not limited to the structure of FIG. 2, and an additional layer may be further provided. In FIG. 2, a means a line width of the conductive line, and b means a line interval between the adjacent conductive lines.

According to the exemplary embodiment of the present specification, the substrate may be a transparent substrate. Particularly, according to the exemplary embodiment of the present specification, the substrate may be glass or polyethylene terephthalate (PET), polycarbonate (PC), or polyamide (PA). Otherwise, according to the exemplary embodiment of the present specification, the substrate may be an insulating layer of a liquid crystal display device. Particularly, the substrate may be a predetermined member, in which the first metal layer is provided.

According to the exemplary embodiment of the present specification, a transparent conductive layer may be further provided between the substrate and the first metal layer.

According to the exemplary embodiment of the present specification, a transparent conductive oxide layer may be used as the transparent conductive layer. An indium oxide, a zinc oxide, an indium tin oxide, an indium zinc oxide, an indium zinc tin oxide, an amorphous transparent conductive polymer, and the like may be used as the transparent conductive oxide, and one or two or more kinds thereof may be used together, but the transparent conductive oxide is not limited thereto. According to the exemplary embodiment of the present specification, the transparent conductive layer may be an indium tin oxide layer.

According to the exemplary embodiment of the present specification, each of the first metal layer and the second metal layer may be formed by using a method, such as evaporation, sputtering, wet coating, vaporization, electrolytic plating or electroless plating, and lamination of a metal foil.

Further, according to the exemplary embodiment of the present specification, each of the first metal layer and the second metal layer may be formed by using a printing method. Particularly, the printing method may use an ink or a paste including a metal, and the paste may also further include a binder resin, a solvent, a glass frit, and the like in addition to the metal.

According to the exemplary embodiment of the present specification, the light reflection reducing layer may be formed by a deposition process in a nitrogen atmosphere.

According to the exemplary embodiment of the present specification, the conductive line may be formed by patterning the first metal layer, the second metal layer, and the light reflection reducing layer. The patterning may be simultaneously performed on the first metal layer, the second metal layer, and the light reflection reducing layer.

According to the exemplary embodiment of the present specification, the patterning may use a material having an etching resist characteristic. The etching resist may form a resist pattern by using a printing method, a photolithography method, a photography method, a dry film resist method, a wet resist method, a method using a mask, or laser transferring, for example, thermal transfer imaging, and particularly, may use a dry film resist method. However, the etching resist is not limited thereto. The first metal layer, the second metal layer, and/or the light reflection reducing layer are etched and patterned by using the etching resist pattern, and the etching resist pattern may be easily removed by a strip process.

According to the exemplary embodiment of the present specification, in the patterning, the first metal layer, the second metal layer, and the light reflection reducing layer are etched together by using an etchant.

The exemplary embodiment of the present specification provides an electrode including the conductive structure body.

According to the exemplary embodiment of the present specification, the electrode may be an electrode for a touch panel, an electrode for a liquid crystal display, or an electrode for an OLED display.

An exemplary embodiment of the present specification provides a display device including an electrode.

In the present specification, a display device, collectively referring to a TV, a computer monitor or the like, includes a display device that forms an image, and a casing that supports the display device.

According to the exemplary embodiment of the present specification, the electrode may be an electrode for a touch sensor of a touch screen panel.

According to the exemplary embodiment of the present specification, the electrode may be a wiring electrode, a common electrode, and/or a pixel electrode of a liquid crystal display device. Particularly, the electrode may be a wiring electrode, a common electrode, and/or a pixel electrode of an IPS liquid crystal display device.

According to the exemplary embodiment of the present specification, the electrode may be a wiring electrode, a common electrode, and/or a pixel electrode of an OLED display device.

According to the exemplary embodiment of the present specification, the electrode may be a pixel electrode of an OLED lighting device.

Hereinafter, the present specification will be described in detail with reference to the Examples. However, the Examples according to the present specification may be modified in various forms, and the scope of the present specification is not interpreted as being limited to the Examples described in detail below. The Examples of the present specification are provided for more completely explaining the present specification to those skilled in the art.

Example and Comparative Example

The present inventors performed a simulation of light reflectance of a first metal layer formed of Cu, a second electrode layer formed on the first metal layer and formed of MoTi, and a light reflection reducing layer formed on the second electrode layer, having a thickness of 45 nm, and formed of MoTiON.

Simulation data of light reflectance in a surface of the light reflection reducing layer of the case where a thickness of the second metal layer is set to 0 nm as the Comparative Example, and the case where a thickness of the second metal layer is set to 5 nm, 10 nm, 15 nm, 30 nm, and 30 nm as the Example is represented in FIG. 3.

Referring to FIG. 3, it can be seen that compared to the Comparative Example, in which the second metal layer is not provided, light reflectance of the Example, in which the second metal layer is provided, is low in the entire wavelength region. Accordingly, it is possible to infer low light reflectance in the surface of the light reflection reducing layer of the conductive structure body according to the exemplary embodiment of the present specification.

EXPLANATION OF REFERENCE NUMERALS AND SYMBOLS

100: Substrate
200, 210: First metal layer
300, 310: Second metal layer
400, 410: Light reflection reducing layer

The invention claimed is:

1. A conductive structure body, comprising:
   a substrate;
   a first metal layer provided on the substrate, and formed of a single metal, of which an average light reflectance of light having a wavelength of 380 nm to 780 nm in a thickness of the first metal layer having 0% of light transmissivity is 60% to 100%;
   a second metal layer provided on at least one surface of the first metal layer, formed of a translucent layer of MoTi present in a thickness having 1% to 60% light transmissivity in a visible ray region; and
   a light reflection reducing layer comprising an oxynitride of MoTi provided on the second metal layer and formed of a translucent material,
   and
   an average light reflectance in the surface of the light reflection reducing layer in light having a wavelength of 380 nm to 780 nm is decreased by 7% to 50% compared to a case where the second metal layer is not provided, and
   wherein an extinction coefficient (k) of the second metal layer in light having a wavelength of 380 nm to 780 nm is 2.9 or more and 3.8 or less.

2. The conductive structure body of claim 1, wherein the second metal layer is formed of two or more kinds of metal, of which average light reflectance in light having a wavelength of 380 nm to 780 nm in a thickness of the second metal layer having 0% of light transmissivity is 40% to 60%.

3. The conductive structure body of claim 1, wherein a thickness of the first metal layer is 10 nm or more and 1 μm or less.

4. The conductive structure body of claim 1, wherein a thickness of the second metal layer is 3 nm or more and 35 nm or less.

5. The conductive structure body of claim 1, wherein a thickness of the light reflection reducing layer is 10 nm or more and 100 nm or less.

6. The conductive structure body of claim 1, wherein an average light reflectance in a surface of the light reflection reducing layer in light having a wavelength of 380 nm to 780 nm is 25% or less.

7. The conductive structure body of claim 1, wherein an extinction coefficient (k) of the light reflection reducing layer in light having a wavelength of 380 nm to 780 nm is 0.2 or more and 1 or less.

8. The conductive structure body of claim 1, further comprising:
   conductive lines provided on the substrate,
   wherein the conductive line includes the first metal layer, the second metal layer, and the light reflection reducing layer.

9. The conductive structure body of claim 8, wherein the conductive line includes a conductive pattern including a plurality of openings and the conductive lines dividing the plurality of openings.

10. The conductive structure body of claim 9, wherein a line width of the conductive line is 0.1 μm or more and 100 μm or less.

11. The conductive structure body of claim 9, wherein a line interval between the adjacent conductive lines is 0.1 μm or more and 100 μm or less.

12. An electrode comprising the conductive structure body of claim 1.

13. The electrode of claim 12, wherein the electrode is an electrode for a touch panel, an electrode for a liquid crystal display, or an electrode for an OLED display.

14. A display device comprising the electrode of claim 12.

* * * * *